(12) United States Patent
Yu et al.

(10) Patent No.: US 7,286,014 B2
(45) Date of Patent: Oct. 23, 2007

(54) VARIABLE GAIN DEVICE

(75) Inventors: Chung-Che Yu, Taipei (TW);
Shian-Sung Shiu, Taipei (TW); Li-Min Lee, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 70 days.

(21) Appl. No.: 11/308,019

(22) Filed: Mar. 3, 2006

(65) Prior Publication Data

US 2007/0115057 A1  May 24, 2007

(30) Foreign Application Priority Data

Nov. 24, 2005  (TW) .............................. 94141248 A

(51) Int. Cl.
*H03F 3/45* (2006.01)
(52) U.S. Cl. ...................................... 330/254; 330/278
(58) Field of Classification Search ................ 330/254, 330/253, 278, 257, 288, 261
See application file for complete search history.

(56) References Cited

U.S. PATENT DOCUMENTS 5,528,197 A * 6/1996 Frey ............................ 330/254
6,084,466 A * 7/2000 Phanse et al. .............. 327/560
6,300,845 B1 * 10/2001 Zou ............................ 332/178

* cited by examiner

*Primary Examiner*—Henry Choe
(74) *Attorney, Agent, or Firm*—Jianq Chyun IP Office

(57) ABSTRACT

A variable gain device having higher linearity and wider gain range is provided. The variable gain device includes a transduction unit for generating an output current, a control unit for adjusting the current gain of the gain amplifying unit according to a gain control signal, a gain amplifying unit receiving the current signal and generating a gain adjustable current according to the current gain of the control unit, an output DC level control unit controlling the DC level of the output signal of the variable gain device, and an output unit generating an output signal according to the signals output by the output DC level control unit and the gain amplifying unit.

24 Claims, 3 Drawing Sheets

VARIABLE GAIN DEVICE

CROSS-REFERENCE TO RELATED APPLICATION

This application claims the priority benefit of Taiwan application serial no. 94141248, filed on Nov. 24, 2005. All disclosure of the Taiwan application is incorporated herein by reference.

BACKGROUND OF THE INVENTION

1. Field of Invention

The present invention relates to a device for signal processing. More particularly, the present invention relates to a variable gain signal processing device.

2. Description of Related Art

In an image signal processing system, the strength of the signal received by the system is always changed considerably during transmission. Thus, the circuits with auto gain control (AGC) are usually used to automatically adjust the strength of signal received by the system to meet the system's input signal specification. A variable gain device, or referred to as variable gain amplifier (VGA), is indispensable in an AGC system.

To ensure the received signal meets various input signal specification requirements of the system, some VGA designs are widely used and discussed in the literature. Moreover, for ensuring that the system to have an ideal image output quality, the VGA has to have such characteristics as lower distortion and wider frequency range. Meanwhile, for overcoming the characteristic of the strength of the signal received by the system having wider range of variation, the VGA has to have wider gain range and higher linearity. Accordingly, a VGA having lower distortion, wider frequency range, and wider gain range has become a critical device in an image signal processing system.

FIG. 1 is a circuit diagram of a conventional VGA. Referring to FIG. 1, the conventional VGA includes 6 transistors 101, 102, 103, 104, 105, 106, an attenuation resistor network 113, a first output resistor 107, a second output resistor 108, a first current source 109, a second current source 110, a third current source 111, and a fourth current source 112. In which, the transistors 101 and 102 form an input differential pair, and the attenuation resistor network 113 includes two sets of attenuation resistors RA1~RAn and RB1~RBn, and 2(n+1) switches SA1~SA(n+1) and SB1~SB(n+1), where n is a positive integer.

The transistors 101, 103 and a plurality of attenuation resistors RA1~RAx in the attenuation resistor network 113, and the transistors 102, 104, and a plurality of attenuation resistors RB1~RBy in the attenuation resistor network 113 form a transduction feedback circuit, respectively, in which x and y are both positive integers smaller than n. In addition, the transistors 103, 105 and the transistors 104, 106 form a current gain stage, respectively. Since the transistors 101 and 102 are forcibly turned on with the current of the first current source 109 and the current of the second current source 110 respectively, therefore, the transistors 101 and 102 of the input terminal can be ideally regarded as a DC level shifter. Thus, the input voltage at the gates of the transistors 101 and 102 can be linearly transmitted to the sources of the transistors 101 and 102. The currents passing through the transistors 103 and 104 can be regarded as a combination of a DC component current and an AC component current. In which, the DC component current conducted by the transistor 103 is the current of the third current source 111 deducted with the current of the first current source 109; and the AC component current conducted by the transistor 103 is approximately equal to the input signal divided by a portion of the attenuation resistance in the attenuation resistor network 113. This portion of the attenuation resistance does not include the resistance of the foregoing transduction feedback circuit. The portion of switches SA1, SA2, . . . , SA(n+1) and SB1, SB2, . . . SB(n+1) are switched (only one pair of corresponding switches are turned on at one time, while the remaining switches is turned off) to change the gain of the amplifier, so that the AC component current is changed according to the attenuation resistance corresponding to each pair of switches SA1, SA2, . . . , SA(n+1) and SB1, SB2, . . . SB(n+1). Accordingly to the above effect, the changes of the AC component current are respectively transmitted to the first output resistor 107 and the second output resistor 108 through the current gain stage transistors 103, 105 and the transistors 104, 106, so as to obtain the required gain.

In a conventional circuit, the gain generated is determined by the attenuation resistance and the internal resistance of the switches when the switches are turned on. However, the internal resistance of the switches SA1, SA2, . . . , SA(n+1), SB1, SB2, . . . SB(n+1) when the switches are turned on changes along with the oscillation amplitude of the input signal; meanwhile, the internal resistance of each turned-on switch is different, and thus the output linearity is not adequate. In addition, when the specification of the VGA requires wider gain range and smaller unit of gain, the number of attenuation resistors and switches required will be excessively large and complicated, which results in the increase in manufacturing cost. The unit of gain is referred to the difference between the gains corresponding to two adjacent switches, and the difference between the gains of each two adjacent switches is approximately same since the VGA is a linear amplifier.

SUMMARY OF THE INVENTION

Accordingly, the present invention is to provide a variable gain device (or amplifier), which has higher linearity and wider gain range, and at the same time, can provide minimum unit gains to meet various systems.

According to another objective of the present invention, a variable gain amplifier (VGA) with adjustable output DC level is provided, which can, through an adjustable output DC level control unit, overcome the device error and device mismatch due to process parameter shift during the semiconductor manufacturing process. Accordingly, the output signal thereof can easily meet the input signal range of the next stage unit through the adjustable output DC level control unit.

The present invention provides a linear VGA having wider gain range and adjustable output DC level, which includes a transduction unit, a gain amplifying unit, a gain control unit, an output DC level control unit, and an output unit. In which, an input voltage is converted by the transduction unit into an output current and the output current is outputted to the gain amplifying unit. The current gain of the gain amplifying unit is adjusted by the gain control unit according to a gain control signal of the VGA, and so the gain amplifying generates a gain adjustable current signal according to the gain control signal and the current signal. The DC level of the output signal of the VGA is adjusted by the output DC level control unit. The output unit receives the gain adjustable current signal and generates an output signal of the VGA.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
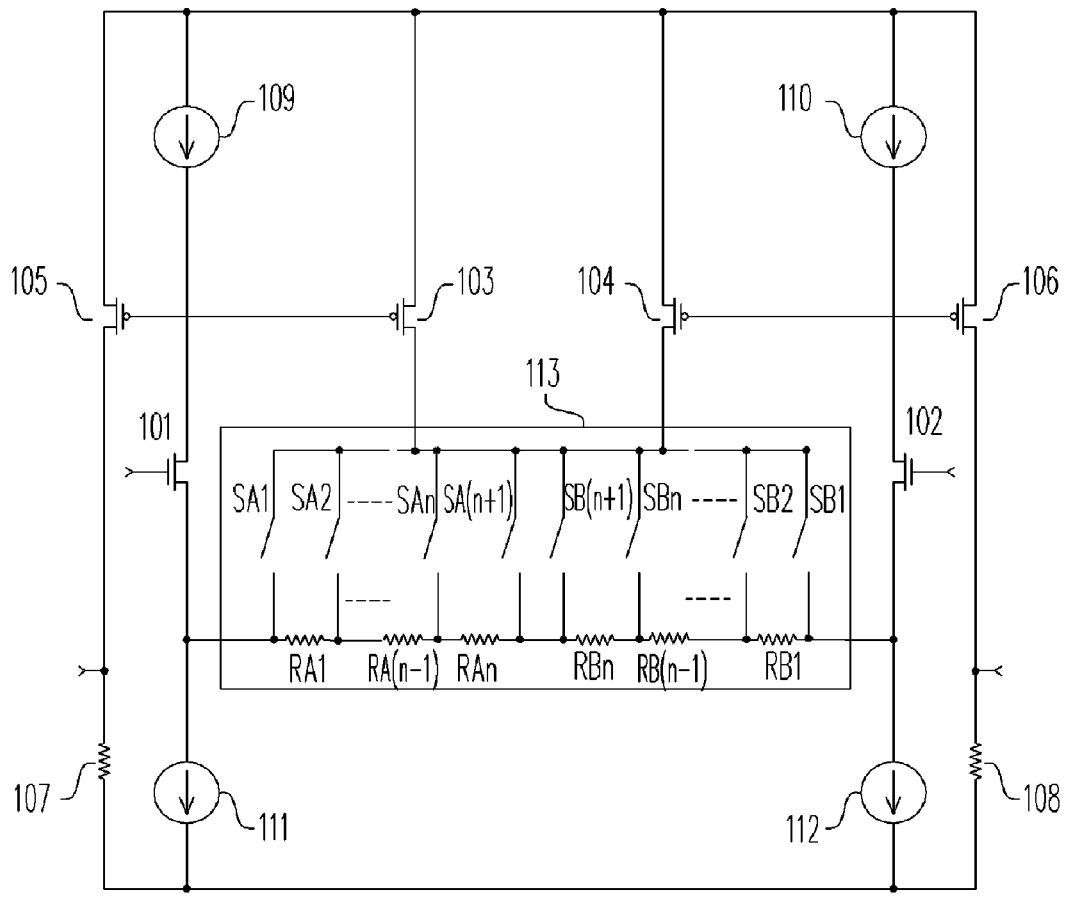
FIG. 1 is a circuit diagram of a conventional variable gain amplifier.
Figure 2:
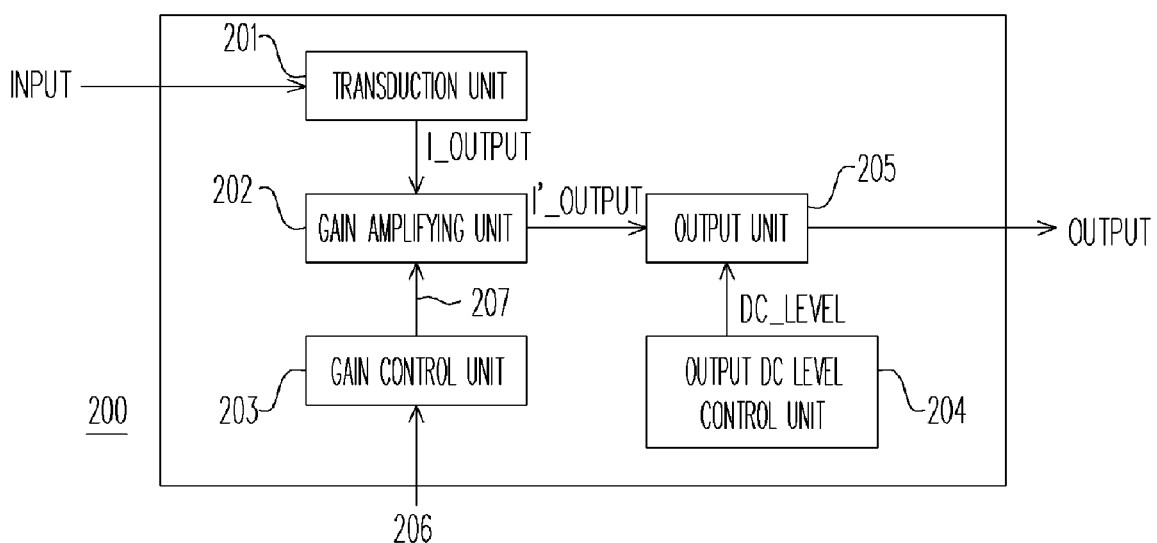
FIG. 2 is a circuit block diagram of a variable gain amplifier according to an embodiment of the present invention.

FIG. 2 is a circuit block diagram of a variable gain amplifier according to an embodiment of the present invention. Referring to FIG. 2, the variable gain amplifier (VGA) 200 includes the following: a transduction unit 201 for converting an input voltage INPUT into an output current I_OUTPUT; a gain control unit 203 for generating a gain control signal 207 according to a gain control signal 206 of the VGA 200; a gain amplifying unit 202 for receiving the output current signal I_OUTPUT output from the transduction unit 201, and the gain control signal 207, in which the circuit in the gain amplifying unit 202 is to determine a current gain with adjustable range according to the gain control signal 207, and an output signal I'_OUTPUT is generated by amplifying (or reducing) the current signal I_OUTPUT output from the transduction unit 201 based on the current gain; an output DC level control unit 204 for generating a DC level signal DC_LEVEL to adjust the DC level of the output signal OUTPUT of the VGA 200; and an output unit 205 for receiving the output I'_OUTPUT of the gain amplifying unit 202 and the output DC_LEVEL of the output DC level control unit 204 to generate an output signal OUTPUT.

Figure 3:
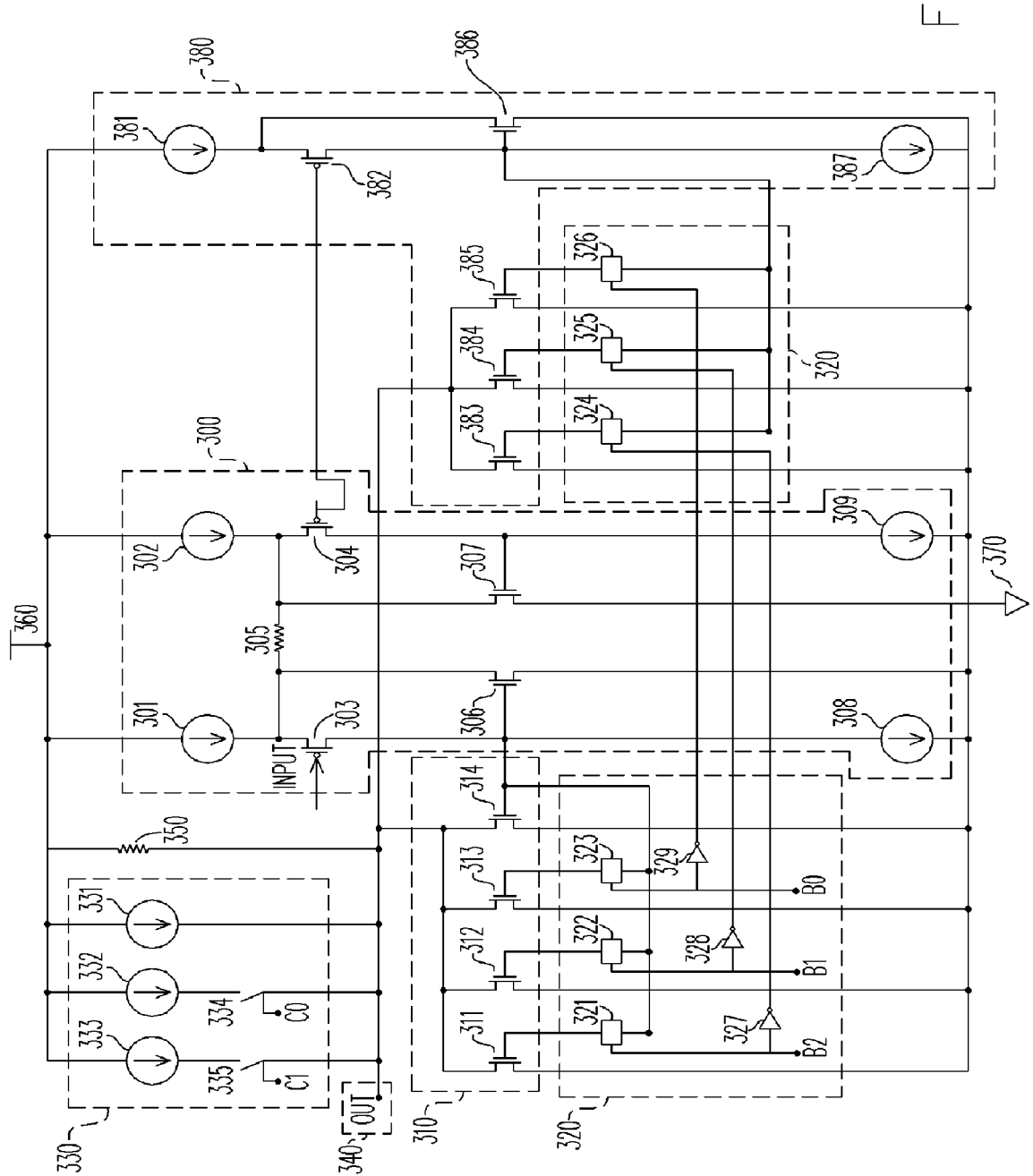
FIG. 3 is a circuit diagram of a variable gain amplifier according to an embodiment of the present invention.

FIG. 3 is a circuit diagram of a VGA according to an embodiment of the present invention. Referring to FIG. 3, in the present embodiment, besides a transduction unit 300, a gain amplifying unit 310, and a gain control unit 320, the VGA further includes an output unit 340 including an output resistor 350, a DC voltage source 360, a ground terminal 370; and an output DC level control unit including a first DC level control circuit 330 and a second DC level control circuit 380.

The present embodiment is a VGA of single-ended input and single-ended output, in which both are formed by using MOS transistors in the present embodiment. The transduction unit 300 includes a first current source 301, a second current source 302, a third current source 308, a fourth current source 309, a plurality of PMOS transistors 303 and 304, a resistive device 305, and a plurality of NMOS transistors 306 and 307.

The gain amplifying unit 310 includes a plurality of NMOS transistors 311, 312, 313, and 314. The gain control unit 320 includes a plurality of switches 321, 322, 323, 324, 325, 326 and a plurality of inverters 327, 328, 329.

The first DC level control circuit 330 inside the output DC level control unit includes a fifth current source 331, a sixth current source 332, a seventh current source 333, and a plurality of switches 334, 335. The second DC level control circuit 380 includes an eighth current source 381, a PMOS transistor 382, a plurality of NMOS transistors 383, 384, 385, 386, and a ninth current source 387.

In the present embodiment, the gain amplifying unit 310 has a 3-bit gain adjustable range, in which the 3-bit gain control manner is to adjust the gain range by using binary digital control signals B0, B1, and B2. The first DC level control circuit 330 has a 2-bit output DC level adjustable range. In the first DC level control circuit 330, binary digital control signals C0 and C1 are also used for adjusting the DC level of output signals. In which, the current gain of the gain amplifying unit 310 is adjusted by the control of the gain control unit 320 to obtain an output signal with adjustable amplitude at the output unit 340.

In the structure of the present embodiment, the number of the NMOS transistors in the gain amplifying unit 310 could be increased to expand the VGA into an N-bit (N is a positive integer) gain range. Meanwhile, in the gain control unit 320, the corresponding voltage switches and inverters in the gain control unit 320 and the second DC level control circuit 380 are added.

In addition, to overcome the output DC level shift caused by device mismatch or device resistance variation generated by process parameter shift during semiconductor manufacturing process, the first DC level control circuit 330 in the output DC level control unit could also be changed to have M-bit digital control, in which M is also a positive integer. M can be equal to N or not equal to N, according to the requirements. The detailed specifications of the VGA will be described separately below.

The input terminal of the VGA is formed by a differential pair of the PMOS transistors 303 and 304, in which the sources of the PMOS transistors 304 and 303 are connected by a resistive device 305, and the first current source 301 and the second current source 302 are respectively connected to the DC voltage source 360 and the sources of the PMOS transistors 303 and 304. The PMOS transistors 303 and 304 can be regarded as a DC level shifter ideally since the PMOS transistors 303 and 304 respectively are forcibly conducted with the currents generated by the third current source 308 and the fourth current source 309. Accordingly, the voltages inputted from the gates of the PMOS transistors 303 and 304 will be transmitted linearly to the sources of the PMOS transistors 303 and 304.

The conducted currents of the NMOS transistors 306 and 307 can be divided into a DC component current and an AC component current. To be specific, the DC component currents of the NMOS transistors 306 and 307 are respectively the current of the first current source 301 deducted by the current of the third current source 308, and the current of the second current source 302 deducted by the current of the fourth current source 309. Moreover, the AC component current is approximately the difference between the input voltages of the gates of the PMOS transistors 303 and 304 divided by the attenuation resistance 305. In the present embodiment, since the VGA has single-ended input and single-ended output, the gate voltage of the PMOS transistor 304 shall be as a DC bias, thus the selection of the DC bias is determined according to the oscillation range of the input signal INPUT.

A current mirror structure is formed by the NMOS transistor 314 in the gain amplifying unit 310 and the NMOS transistor 306 in the transduction unit 300, so that the DC component current and AC component current conducted by the NMOS transistor 306 are duplicated to the NMOS transistor 314. However, the ratio of the conducted currents is determined according to the current magnification ratio of the current mirror, i.e. according to the channel width/length ratios of the NMOS transistors 306 and 314. In the structure provided by the present embodiment, the output gain of the VGA could be obtained according to the current magnification ratio once the current magnification ratio is determined.

In the present embodiment, the current magnification ratio is assumed to be 1, that is, the NMOS transistors 314 and 306 have the same channel length Ln and the same channel width Wn. In addition, a gain amplifying unit 310 having 3-bit gain range is adopted in the present embodiment for adjusting the current gain of the gain amplifying unit 310. The gain amplifying unit 310 includes the NMOS transistors 311, 312 and the NMOS transistors 313. In which, to make sure that the output of the VGA have good linearity, the channel lengths of the NMOS transistors 311, 312, and 313 are the same as that of the NMOS transistor 314 (or the same as that of the NMOS transistor 306 at the same time), while the channel widths of the NMOS transistors 311, 312, and 313 are adjusted according to the gain range.

To achieve high linearity of the output gain, in the present embodiment, the channel width of the NMOS transistor 313 is Wna, and the channel width of the NMOS transistor 312 is 2Wna. Moreover, the channel width of the NMOS transistor 311 is 4Wna. Therefore, the gain range of the VGA can be adjusted through the on/off of the NMOS transistors 311, 312, and 313.

Figure 4:
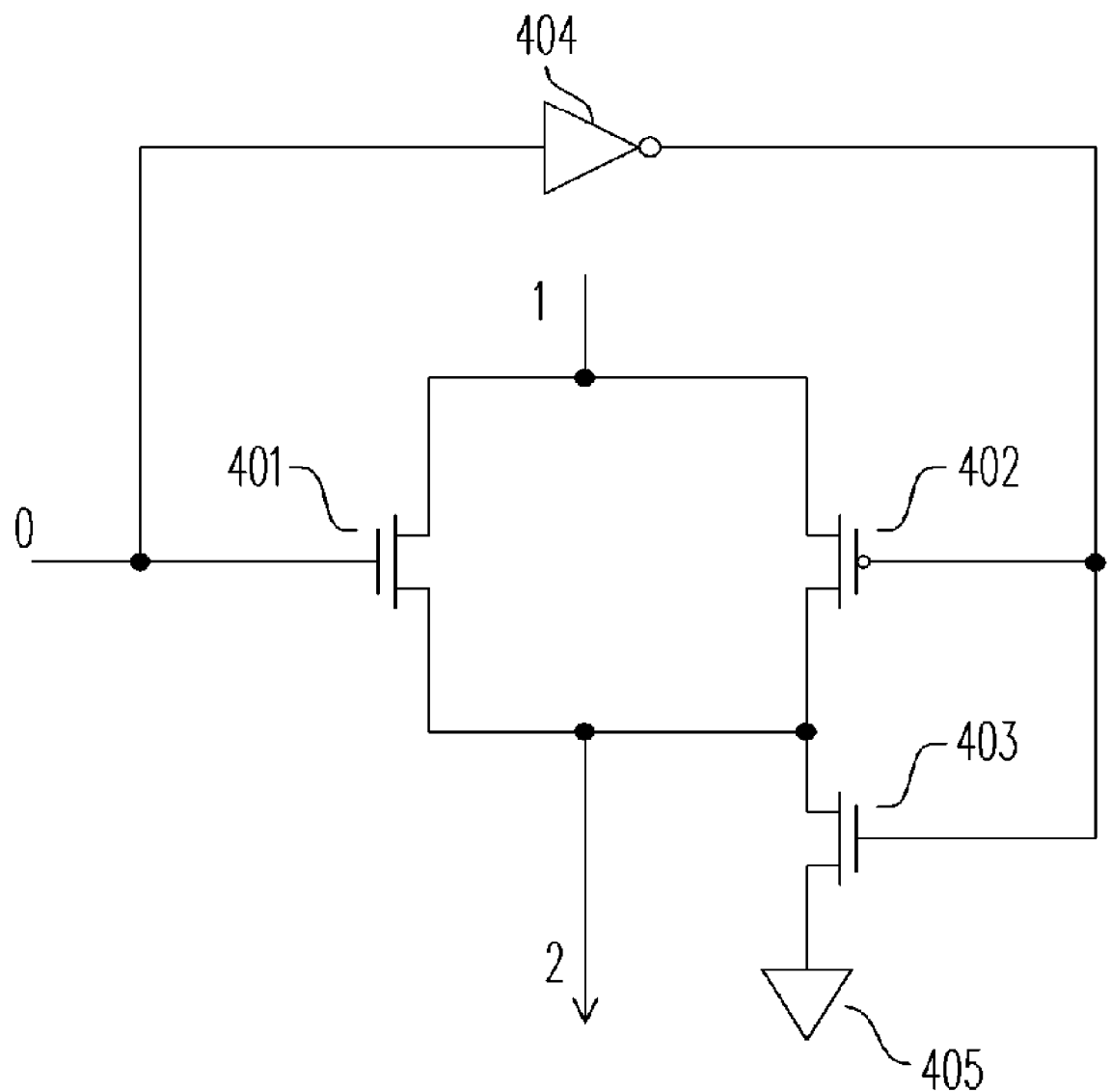
FIG. 4 is a circuit diagram of a voltage switch according to an embodiment of the present invention.

Moreover, the gain control unit 320 is formed by the voltage switches 321, 322, 323, 324, 325, 326 and the inverters 327, 328, 329. The voltage switches 321, 322, 323, 324, 325, and 326, as shown in FIG. 4, are formed by a plurality of NMOS transistors 401 and 403, a PMOS transistor 402, an inverter 404, and a ground terminal 405. In which the voltage switches 321, 322, 323, 324, 325, and 326 are three-terminal devices, which are respectively the control terminal 0, the signal input terminal 1, and the signal output terminal 2. The circuit structure of the voltage switches 321, 322, 323, 324, 325, and 326 is as shown in FIG. 4.

When the voltage of the control terminal 0 in the voltage switches 321, 322, 323, 324, 325, and 326 is at high level, the signal output of the signal output terminal 2, i.e., these terminals connected to the gates of the NMOS transistors 311, 312, 313 , 383, 384, and 385, is the DC bias level provided by the signal input terminal 1. On the other hand, when the voltage at the control terminal 0 is at low level, the output level of the signal output terminal 2 is at ground level. Thus, the voltage statuses of the output terminals 2 of the voltage switches 321, 322, 323, 324, 325, and 326 can be controlled through the control signals B2, B1, and B0 of the gain control unit 320. The gain amplifying unit 310 controls the on/off statuses of the NMOS transistors 311, 312, and 313 of the gain amplifying unit 310 and the NMOS transistors 383, 384, and 385 of the second DC level control unit 380 according to the voltage statuses of the output terminals 2 of the voltage switches 321, 322, 323, 324, 325, and 326, so as to achieve the function for gain amplification adjustments. In the present embodiment, when B2='0', B1='0', and B0='0',the VGA has the minimum gain, and when B2='1', B1='1', and B0='1', the VGA has the maximum gain. '0' and '1' represent logic low level and at logic high level, respectively.

Since the present embodiment is a VGA having a single-ended input and a single-ended output. When the NMOS transistors 311, 312, and 313 in the gain amplifying unit 310 are on or off, the DC level of the output signal in the output unit 340 will be affected because of the on/off statuses of the NMOS transistors 311, 312, and 313. To overcome the aforementioned problem, a second DC level control circuit 380 is required. The second DC level control circuit 380 includes an eighth current source 381, a PMOS transistor 382, a plurality of NMOS transistors 383, 384, 385, 386, and a ninth current source 387.

In which, the NMOS transistor 385 and the NMOS transistor 313 of the gain amplifying unit, the NMOS transistor 384, and the NMOS transistor 312, and the NMOS transistor 383 and the NMOS transistor 311, respectively, have the same channel lengths and the same channel widths. With the assistance of the second DC level control circuit 380, when the statuses of the control signals B2, B1, and B0 of the gain control unit 320 are changed, the output statuses of the output terminals 2 of the voltage switch 321 of the gain control unit 320 and the corresponding voltage switch 324, the voltage switch 322 and the corresponding voltage switch 325, and the voltage switch 323 and the corresponding voltage switch 326 are reversed. In other words, when the output voltage of the output terminal 2 of the voltage switch 321 is a DC bias, the output voltage of the output terminal 2 of the corresponding voltage switch 324 is a ground voltage.

Thus, when the NMOS transistors 311, 312, and 313 of the gain amplifying unit 310 are turned on or off, the DC component current increased or reduced to the output terminal thereof will offset each other through the on/off of the NMOS transistors 383, 384, and 385. Accordingly, the output DC level will not be affected by the change of the statuses of the control signals B2, B1, and B0.

In the semiconductor manufacturing process, the shifting of process parameters may result in changes in devices resistance and electrical characteristics, which will further affect the DC level of the output signals of the output unit 340. Thus, the change in the DC level may most likely affect the operational characteristics of the devices at the next stage (i.e., the devices connected to the output of the VGA in the present invention), so that the errors in the output of the next stage devices could be caused. Therefore, the DC level of the output signal has to be compensated through the first DC level control circuit 330 in the DC level control unit. In the present embodiment, the first DC level control circuit 330 in the DC level control unit can be formed by a fifth current source 331, a sixth current source 332, a seventh current source 333, and the switches 334, 335. In which, the base value of the VGA DC level is provided by the current source 331, and the current sources 332, 333 and the switches 334, 335 are used for adjusting the output DC level. Thus, the DC level of the output signal can be adjusted to meet the operational characteristics of the devices at the next stage via the DC level control signals C0 and C1.

The embodiment described above is only one of the embodiments of the present invention, so that the present invention is not limited to using the PMOS transistors as the input differential pair or using the NMOS transistors for forming the gain amplifying circuit. In other words, those skilled in the art can also use the NMOS transistors as the input differential pair and the PMOS transistors for forming the gain amplifying circuit. Meanwhile, the present invention can also be implemented by replacing the PMOS transistors with the PNP transistors and the NMOS transistors with the NPN transistors.

In actual application of the setting of the gain in the present invention, besides magnifying the input signal, minifying the input signal also be implemented while the input signal is excessively large.

The main advantage of the present invention is that the gain amplifying circuit adjusts the gain range through changing of the current ratio of the transistors. Accordingly, the change of the output signal gain is highly linear. With the aforementioned control method of changing the gain range, a VGA having wider gain range and highly linear output can be easily designed. Another advantage of the present invention is that the design of the output DC level control unit is to overcome the output signal DC level shifting of the device by means of the DC level control circuit, wherein the output signal DC level shifting may be caused by the errors of process parameter shifting during the semiconductor manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A variable gain device, comprising:
   a transduction unit, for generating a current signal according to an input signal;
   a gain amplifying unit, having a plurality of first transistors, forming a current mirror circuit with the transduction unit, and the channel length/width ratios of the first transistors being different, so as to generate a mirror current signal according to the channel length/width ratios of the corresponding transistors and the current signal; and
   a gain control unit, generating a control signal according to a plurality of control signals, so as to determine the statuses of the first transistors in the gain amplifying unit.

2. The variable gain device as claimed in claim 1 further comprising a DC bias circuit having a plurality of second transistors, wherein each of the second transistors has the same channel length/width ratio as a corresponding transistor of the first transistors.

3. The variable gain device as claimed in claim 2, wherein the statuses of the second transistors and the corresponding first transistors are reversed.

4. The variable gain device as claimed in claim 3, wherein the gain control unit comprises a plurality of inverters used for receiving the plurality of control signals respectively to control the on/off statuses of the second transistors, so as to make the status of each second transistor be reversed to the status of the corresponding first transistor.

5. The variable gain device as claimed in claim 2, wherein the DC bias circuit further comprises two current sources, and the current difference between the two current sources is approximately equal to a DC component current of the current signal of the transduction unit.

6. The variable gain device as claimed in claim 1 further comprising an output unit connected to a DC voltage source through an output resistor.

7. The variable gain device as claimed in claim 1 further comprising an output DC level control unit connected to the gain amplifying unit and having a plurality of current sources and at least one switch, the at least one switch controlling the corresponding current source to adjust the output DC voltage level of the gain amplifying unit.

8. The variable gain device as claimed in claim 7 further comprising a DC bias circuit having a plurality of second transistors, wherein each of the second transistors has the same channel length/width ratio as a corresponding transistor of the first transistor.

9. A variable gain device, comprising:
   a transduction unit, generating a current signal according to an input signal;
   a gain amplifying unit, having a plurality of first transistor, forming a current mirror circuit with the transduction unit, wherein each of the first transistors generates a corresponding current according to the current signal;
   a gain control unit, generating a gain control signal to switch the statuses of the first transistors of the gain amplifying unit; and
   an output DC level control unit, adjusting the output DC level according to the gain control signal.

10. The variable gain device as claimed in claim 9, wherein the first transistors are MOS transistors.

11. The variable gain device as claimed in claim 9 further comprising a DC bias circuit having a plurality of second transistors, wherein each of the second transistors has the same channel length/width ratio as a corresponding transistor of the first transistors.

12. The variable gain device as claimed in claim 11, wherein the statuses of the second transistors and the corresponding first transistors are reversed.

13. The variable gain device as claimed in claim 11, wherein the gain control unit comprises a plurality of inverters used for respectively receiving a plurality of control signals to control the on/off statuses of the second transistors, so as to make the status of each second transistor be reversed to the status of the corresponding first transistor.

14. The variable gain device as claimed in claim 11, wherein the output DC level control unit further comprising:
   a plurality of current sources; and
   at least one switch, determining whether to conduct the current produced by the corresponding current source to the gain amplifying unit and the DC bias circuit according to at least one control signal, respectively.

15. The variable gain device as claimed in claim 9, wherein the output unit is further connected to a DC voltage source through an output resistor.

16. A variable gain device, comprising:
   a transduction unit, used for generating a current signal;
   a gain amplifying unit, having a plurality of first transistors, forming a current mirror circuit with the transduction unit, and the channel length/width ratios of the first transistors being different, so as to generate a mirror current signal according to the length/width ratios of the first transistors and the current signal;
   a gain control unit, generating a gain control signal to switch the statuses of the first transistors in the gain amplifying unit; and
   an output DC level control unit, adjusting the output DC level according to a DC control signal.

17. The variable gain device as claimed in claim 16 further comprising a DC bias circuit having a plurality of second transistors, wherein each of the second transistors has the same channel length/width ratio as a corresponding transistor of the first transistors.

18. The variable gain device as claimed in claim 17, wherein the gain control unit comprises a plurality of inverters used for respectively receiving a plurality of control signals to set the gain of the variable gain device, and the output of the inverters respectively controlling the on/off statuses of the second transistors, so as to make the status of each second transistor being reversed to the status of the corresponding first transistor.

19. The variable gain device as claimed in claim 16 further comprising an output unit used as the output terminal of the variable gain device.

20. The variable gain device as claimed in claim 18, wherein the output unit is further connected to a DC voltage source through an output resistor.

21. The variable gain device as claimed in claim 16, wherein the output DC level control unit comprising:
- a plurality of current sources; and
- a plurality of switches, determining whether or not conduct the current of the corresponding current sources according to the DC level control signals.

22. A variable gain device, comprising:
- a transduction unit, generating a current signal according to an input signal;
- a gain amplifying unit, having a plurality of first transistors, forming a current mirror circuit with the transduction unit, wherein each of the first transistors generates a corresponding current according to the current signal;
- a DC bias circuit, having a plurality of second transistors and two current sources, wherein each of the second transistors has the same channel length/width ratio as a corresponding transistor of the first transistors, and the currents of the second transistors are determined according to the current difference between the two current sources; and
- a gain control unit, switching the statuses of the first and the second transistors according to a gain control signal of the variable gain device.

23. The variable gain device as claimed in claim 22, wherein the statuses of the second transistors and the corresponding first transistors are reversed.

24. The variable gain device as claimed in claim 23, wherein the gain control unit comprises a plurality of inverters used for receiving a plurality of control signals to control the on/off statuses of the second transistors, so as to make the status of each second transistor be reversed to the status of the corresponding first transistor of the first transistors.

* * * * *